(12) United States Patent
Farmer

(10) Patent No.: US 6,867,964 B1
(45) Date of Patent: Mar. 15, 2005

(54) HORIZONTAL MOUNT FOR A PROCESSOR

(75) Inventor: Christopher B. Farmer, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/974,545

(22) Filed: Nov. 19, 1997

(51) Int. Cl.[7] .................................................. G06F 1/16
(52) U.S. Cl. ........................ 361/686; 439/64; 361/759
(58) Field of Search ................................. 361/686, 684, 361/759, 785, 790, 803, 756; 439/64, 377, 347

(56) References Cited

U.S. PATENT DOCUMENTS

| | | | | |
|---|---|---|---|---|
| 5,113,317 A | * | 5/1992 | Howe ........................... | 36/785 |
| 5,530,620 A | * | 6/1996 | Sangveraphunsiri ........ | 361/686 |
| 5,559,672 A | * | 9/1996 | Buras et al. ................ | 361/684 |
| 5,576,935 A | * | 11/1996 | Freer et al. ................. | 361/785 |
| 5,603,618 A | * | 2/1997 | Hayakawa et al. ........... | 439/64 |
| 5,710,733 A | * | 1/1998 | Changson et al. .......... | 361/785 |
| 5,748,446 A | * | 5/1998 | Feightner et al. ........... | 361/690 |
| 5,751,514 A | * | 5/1998 | Hyde et al. .............. | 360/97.01 |
| 5,793,607 A | * | 8/1998 | Karidis et al. .............. | 361/684 |
| 5,825,622 A | * | 10/1998 | Rife et al. ................... | 361/690 |
| 5,889,654 A | * | 3/1999 | Pierson et al. .............. | 361/720 |
| 5,898,869 A | * | 4/1999 | Anderson ....................... | 713/2 |

FOREIGN PATENT DOCUMENTS

| | | |
|---|---|---|
| TW | 240085 | 1/1995 |
| TW | 316002 | 11/1997 |

* cited by examiner

Primary Examiner—Lisa Lea-Edmonds
(74) Attorney, Agent, or Firm—Kenyon & Kenyon

(57) ABSTRACT

One embodiment of the present invention comprises a mount to receive a cartridge processor having an edge connector. The mount includes a motherboard connector mounted on a motherboard oriented to receive the edge connector with the processor in an orientation parallel to the board. Further, the mount may include guides for restraining said processor from movement.

17 Claims, 6 Drawing Sheets

HORIZONTAL MOUNT FOR A PROCESSOR

FIELD OF THE INVENTION

The invention relates to processors in general. More particularly, the invention relates to a method and apparatus for horizontally connecting a microprocessor to a motherboard of a computer.

BACKGROUND OF THE INVENTION

Designs in microprocessor architecture are accelerating at an extraordinary pace. It is conventional wisdom that computer technology becomes outdated every 12 months. This is especially true in the area of microprocessor design where users desire more powerful software applications, thus requiring more powerful microprocessors.

In an attempt to solve the problems associated with placing a microprocessor horizontally into a motherboard (e.g, the large amount of space needed on the motherboard to hold this component), a microprocessor referred to as a single edge connector cartridge (SECC) microprocessor was developed. An example of a SECC microprocessor is illustrated in FIG. 1. As shown in FIG. 1, SECC microprocessor 10 includes a SECC cover 12, a connector 14, and a fan heat sink 16. Connector 14 in this example is a slot 1 connector. Also shown in FIG. 1 is motherboard 20, on which is mounted a receiving slot 18.

As illustrated in FIG. 1, processor 10 has connector 14 on one side of cartridge 12 which is actually housing the microprocessor. Processor 10 can thus be mounted with the larger area of cartridge 12 perpendicular or vertical to motherboard 20. By mounting processor 10 vertically to motherboard 20, processor 10 has a smaller footprint and makes room for additional components on motherboard 20. The vertical placement also allows the addition of heat sink 16 to processor 10.

Although processor 10 solved one set of problems, a new set of problems developed. For example, processor 10 had a smaller footprint which meant precautions were necessary to prevent processor 10 from becoming disconnected from motherboard 20. Disconnection could occur for any number of reasons, such as movement or vibration during transport or shock if someone accidentally bumped the housing for motherboard 20. Moreover, the disconnect problem was augmented for processor 10 because of heat sink 16. The overall weight of processor 10 amounts to approximately one pound with the addition of heat sink 16. The weight of processor 10 means that movement of processor 10 could easily disconnect processor 10 from motherboard 20, and in extreme situations, shatter the relatively fragile structure of motherboard 20.

The problems with processor 10 led to the development of a structure to hold processor 10 in place to ensure it remained stable. This structure, referred to as a "retention module," however, requires a large footprint, thereby significantly removing the footprint advantage gained using an SECC microprocessor. Furthermore, it adds yet another structure required in the assembly of a computer, thus increasing the cost of a computer to the consumer. In fact, many conventional retention modules require two separate structures, that is, one to hold processor 10 and a second to support heat sink 16. Finally, processor 10 requires additional items such as captive fasteners and threaded bridge studs. Consequently, the additional components required by processor 10 add to the overall cost of the computer, as well as increasing the difficulty in assembling the computer during the manufacturing process.

Yet another problem is associated with processor 10. Motherboard 20 and processor 10 are parts of a computer. Thus, motherboard 20 and processor 10, as well as other computer components such as a hard drive, floppy disk drive, power supply, and so forth, are surrounded by a casing. This casing is typically made of hard plastic or metal. This means that processor 10 can not be accessed unless the casing is removed. This requirement has several limitations associated with it. For example, there is no assurance by the eventual purchaser of a computer that the processor is the same processor advertised for the computer. Another example is that repairs or upgrades were difficult to accomplish.

In view of the foregoing, it can be appreciated that a substantial need exists for a new processor mount that addresses the aforementioned problems.

SUMMARY OF THE INVENTION

One embodiment of the present invention comprises a mount to receive a cartridge processor having an edge connector. The mount includes a motherboard connector mounted on a motherboard oriented to receive the edge connector with the processor in an orientation parallel to the board.

DETAILED DESCRIPTION

The present invention includes a method and apparatus that improves upon conventional methods for connecting a microprocessor to a motherboard. The embodiments of the present invention reduce the number of components required to form the connection, thereby reducing the overall cost of manufacturing a computer, and simplifying the assembly of the computer. Furthermore, the embodiments of the present invention permit a user to repair and upgrade a microprocessor without having to physically open the casing which houses the microprocessor. In addition, the present invention permits a user to readily ascertain the type of microprocessor used by the computer. This occurs without consuming any more space on a motherboard than required by an SECC microprocessor and retention module as used in the prior art.

Figure 1:
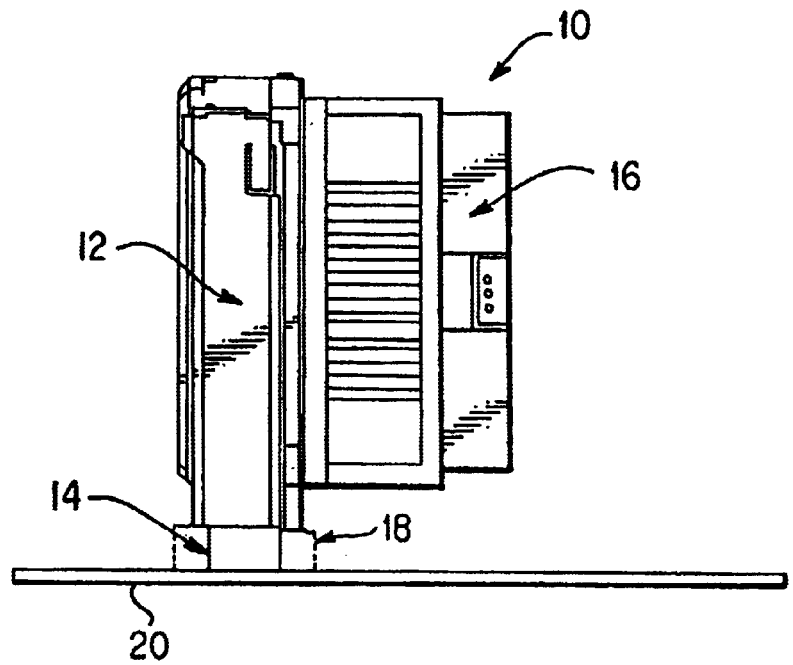
FIG. 1 illustrates a conventional SECC microprocessor.
Figure 2:
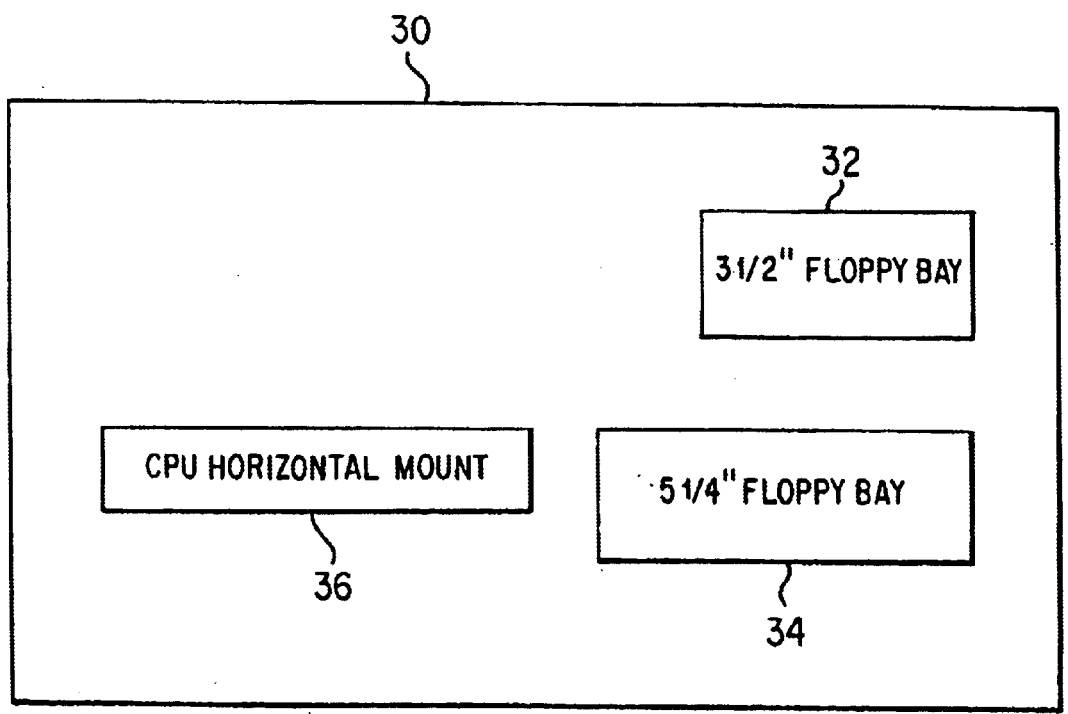
FIG. 2 is an outline drawing in front elevation view of a computer suitable for practicing one embodiment of the present invention.

Referring now in detail to the drawings wherein like parts are designated by like reference numerals throughout, there is illustrated in FIG. 2 the outline front elevation view of a computer suitable for practicing one embodiment of the present invention. As shown in FIG. 2, the computer has a computer casing 30, with drive bays 32 and 34 to house, for example, a 1.44 megabyte (mb) floppy drive and a hard drive, respectively. Computer casing 30 has a slot 36, which forms an access point for the components located within casing 30. Inserted into slot 36 is a processor 40 (see FIG. 3). Once inserted, a portion of processor 40 is visible to a user from outside casing 30. Processor 40 is similar to processor 10 as shown in FIG. 1. Processor 40 is capable of being viewed from outside casing 30, due to a horizontal mount connector described in more detail in FIG. 3.

Figure 3:
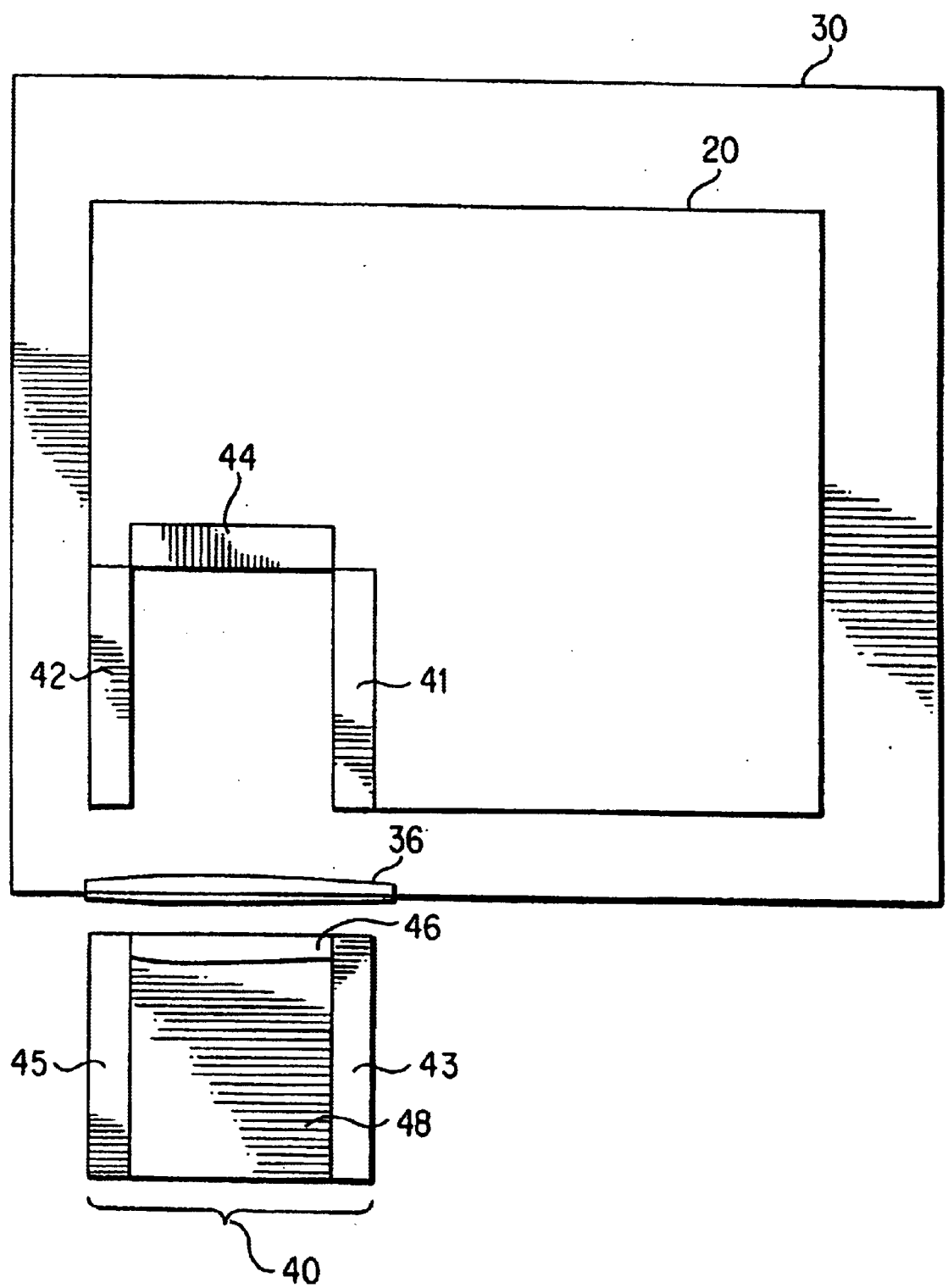
FIG. 3 is a plan view, in outline of the computer of FIG. 2, showing a horizontal mount in accordance with one embodiment of the invention.

FIG. 3 is a plan view, in outline of the computer of FIG. 2, showing a horizontal mount in accordance with one embodiment of the invention. As shown in FIG. 3, a motherboard 20 is within casing 30. In conventional computers, motherboard 20 is substantially square with a vertical connector as shown in FIG. 1. In this embodiment of the invention, however, a portion of motherboard 20 is removed to accommodate processor 40. In this embodiment of the invention, motherboard 20 is equipped with guide slots 41 and 42, which correspond to guide rails 43 and 45 of processor 40, respectively, such that processor 40 can be mounted parallel or horizontal to motherboard 20. As used herein, the term "horizontal mount" refers to a mount that permits a processor to remain substantially parallel to motherboard 20, as opposed to a conventional "vertical mount" that permits a processor to remain substantially perpendicular to motherboard 20. Also, as used herein, the term "parallel" refers to devices that are in the same plane or in different planes.

Figure 9:
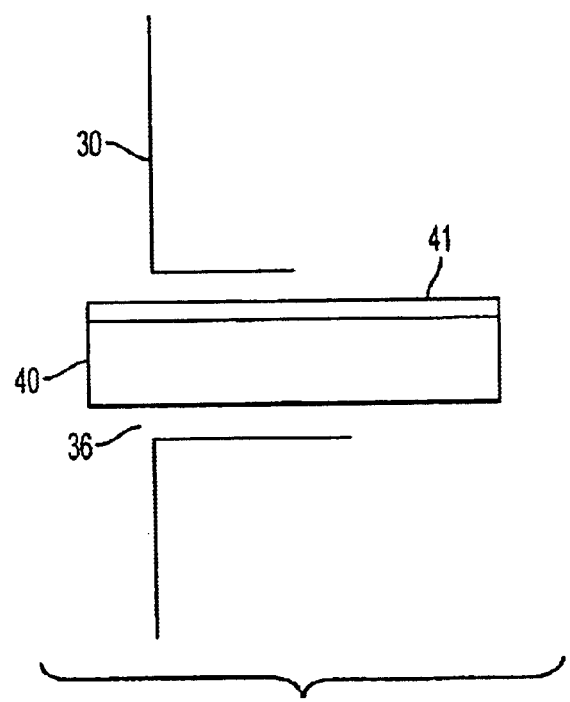
FIG. 9 is a partial side elevation view of a computer in accordance with one embodiment of the invention, wherein the computer has slot to accommodate a processor with a heat sink.

As stated before, processor 40 is similar to processor 10. Processor 40 has an SECC casing 48, a connector 46, and guide rails 43 and 45. Processor 40 can also include a heat sink 41, as shown in FIG. 9, which will be discussed in connection with a different embodiment of this invention.

A microprocessor connector 44 is mounted on motherboard 20. Microprocessor connector 44 is the interface that carries electrical signals between processor 40 and motherboard 20, and forms a receiving slot or "female" connector that is configured to receive the processor leads or "male" connector (i.e., connector 46) of processor 40. Connector 44 is similar to connector 18 shown in FIG. 1, except that connector 44 is horizontal or parallel to motherboard 20, rather than vertical or perpendicular to motherboard 20 as in conventional microprocessor connectors.

In operation, a user can connect processor 40 into motherboard 20 without removing casing 30. The user inserts processor 40 through slot 36. Guide rails 43 and 45 are designed to match guide slots 41 and 42. When the user begins the insertion process the configuration of the guide rails and slot, as well as slot 36, help align processor 40 for smooth connection of connector 46 into connector 44. Once guide rails 43 and 45 are seated in guide slots 41 and 42, respectively, the user can slide processor 40 into slot 36 until connector 46 seats properly with connector 44. A more detailed description of connector 44 is shown in FIG. 4.

It is worthy to note that in this embodiment of the invention guide slots 41 and 42 are designed to receive guide rails 43 and 45 in accordance with principles well known in the art. Guide slots 41 and 42 and guide rails 43 and 45 help guide connector 46 into connector 44 to ensure the proper physical and electrical connection between motherboard 20 and processor 40. It can be appreciated, however, that any means for guiding connector 46 into connector 44 falls within the scope of the invention.

Figure 4:
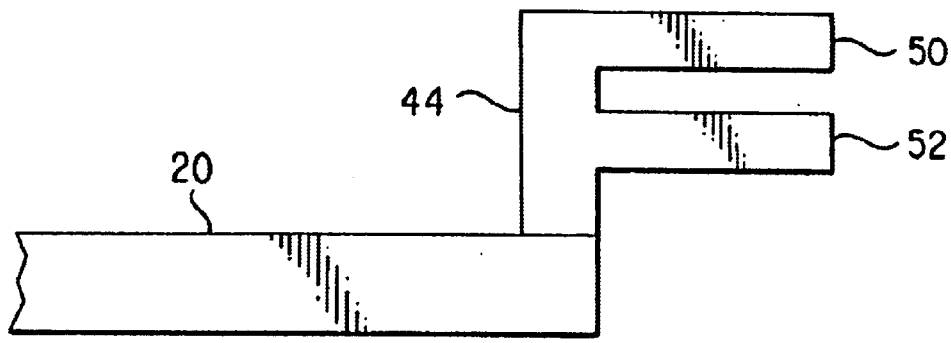
FIG. 4 is a side elevation view of a connector coupled to a motherboard in accordance with one embodiment of the invention.

FIG. 4 is a side elevation view of a connector coupled to a motherboard in accordance with one embodiment of the invention. As shown in FIG. 4, connector 44 includes receiving prongs 50 and 52. Connector 44 is mounted on motherboard 20 such that receiving prongs 50 and 52 are substantially parallel to motherboard 20. In this manner, connector 44 is capable of receiving processor 40 such that processor 40 is parallel to motherboard 20.

Figure 5:
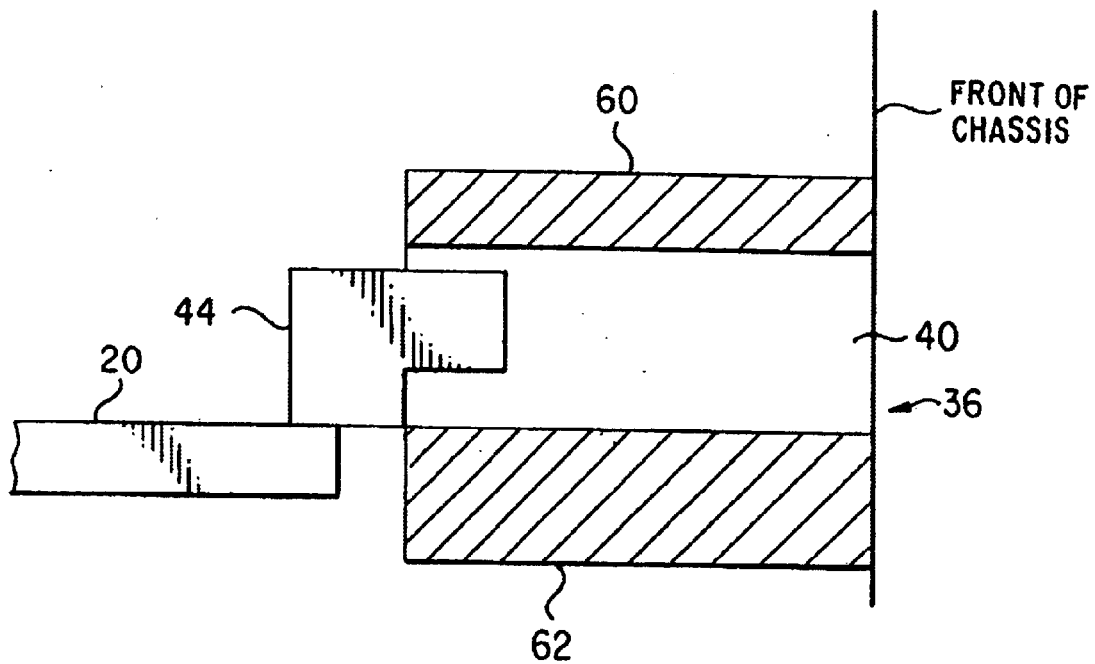
FIG. 5 is a side elevation sectional view of a horizontal mount in accordance with another embodiment of the invention.

FIG. 5 is a side elevation sectional view of a horizontal mount in accordance with another embodiment of the invention. The horizontal mount described with reference to FIG. 5 is similar to that shown in FIG. 3. In FIG. 5, however, guide rails and guide slots are not mounted on processor 40 and motherboard 20, respectively. Rather, a first guide block 60 and a second guide block 62 are used to align processor 40 as it is being inserted into slot 36 so that connector 46 seats properly with connector 44. Guide block 60 is positioned to prevent processor 40 from moving up towards the top of casing 30. Guide block 62 is used to keep processor 40 on track from left to right, and preventing processor 40 from moving down towards the bottom of casing 30.

It is worthy to note that although the various embodiments of the invention described above use specific means for guiding connector 46 into connector 44, it can be appreciated that any number of guiding means could be used that accomplish this function, and still fall within the scope of the invention.

As mentioned previously, conventional processors mount a heat sink on one side of the actual SECC case. An example of a heat sink 41 mounted to a processor 40 according to an embodiment of the present invention is shown in FIG. 9. In such a case, slot 36 would necessarily be wide enough to accommodate the size of the SECC processor and the heat sink. Moreover, the guiding mechanism would be made of sufficient strength to allow for the additional weight of the heat sink, as well as constructed to permit connector 46 to seat properly with connector 44 given the additional bulk of the heat sink. Alternatively, the heat sink could be moved from the processor to the internal structure of the computer within casing 30. An example of this latter type of configuration is shown in FIG. 6.

Figure 6:
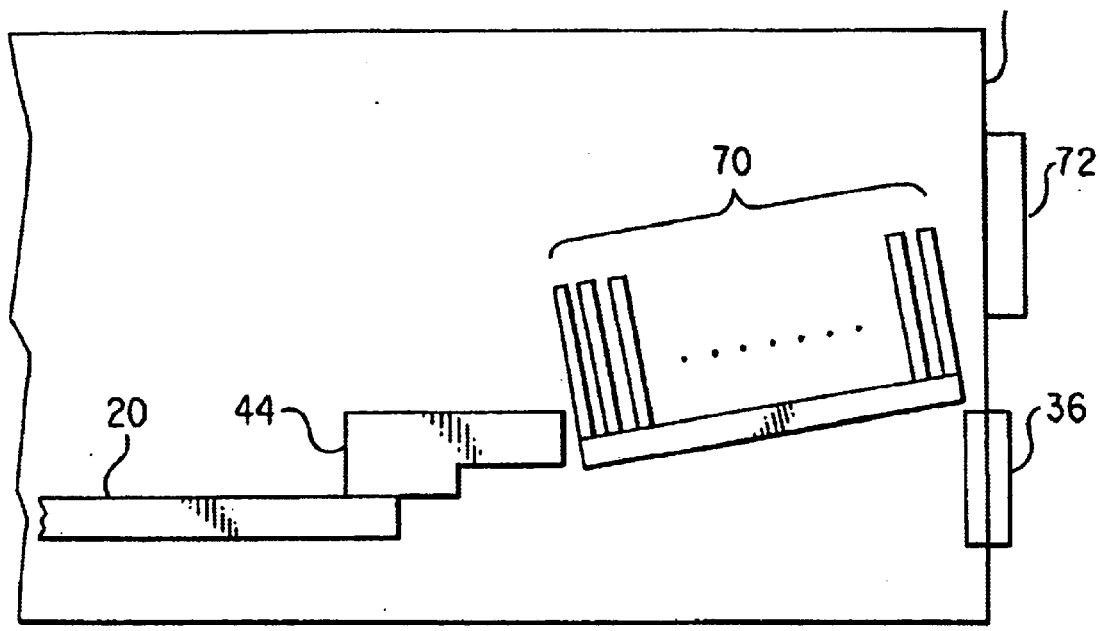
FIG. 6 is a partial side elevation view of a computer showing a heat sink for use in accordance with one embodiment of the invention.

FIG. 6 is a partial side elevation view of a computer showing a heat sink for use in accordance with one embodiment of the invention. As shown in FIG. 6, a heat sink 70 is positioned above slot 36 and between connector 44 and the front of case 30. Heat sink 70 is positioned above slot 36 because if heat sink 70 is mounted beneath processor 40, a problem with heat dissipation arises because heat naturally rises. Also located on the front of case 30 is a fan 72.

Processor 40 is inserted into slot 36, and has a heat sink connector (not shown). Heat sink connector is used to channel heat from processor 40 to heat sink 70. When connector 46 is seated properly with connector 44, heat sink 70 is positioned so that the heat sink connector makes contact with heat sink 70. In this manner, heat from processor 40 is removed by heat sink 70. Heat dissipation can also be augmented using fan 72.

Security is an important consideration because the size of processor 40 is relatively small, and yet the value of processor 40 is large. This creates motivation for a criminal to simply remove processor 40 without authorization. To avoid this situation, one embodiment of the present invention includes a locking mechanism to prevent unauthorized removal once processor 40 has been locked into place.

Figure 7:
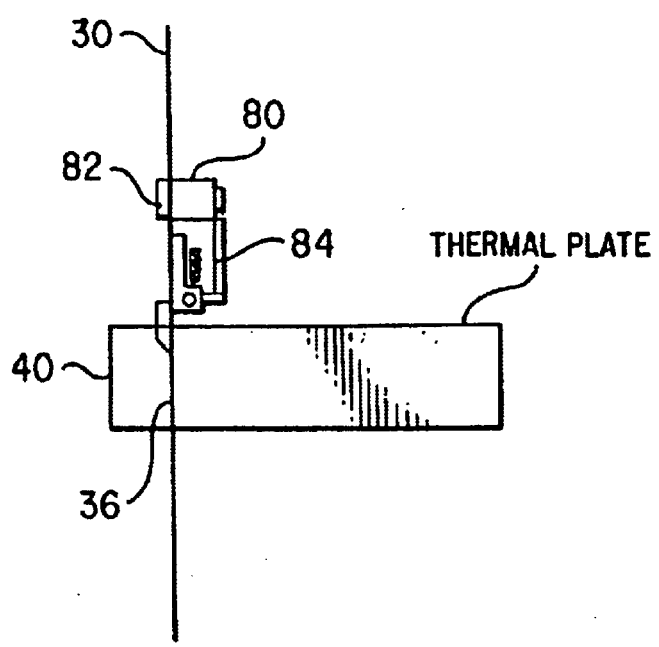
FIG. 7 is a partial side elevation view of a computer having a locking mechanism suitable for use with one embodiment of the invention.

FIG. 7 is a partial side elevation view of a computer having a locking mechanism suitable for use with one embodiment of the invention. As shown in FIG. 7, a lock assembly 80 is mounted on the inside of casing 30. Lock assembly 80 includes a key hole 82 for receiving a key (not shown), and a spring 84. Spring 84 can provide, for example, five pounds of force. Thus, once processor 40 is inserted into slot 36, and guided into place so that connector 46 seats properly within connector 44, a user can lock processor 40 into place using lock assembly 80.

Figure 8:
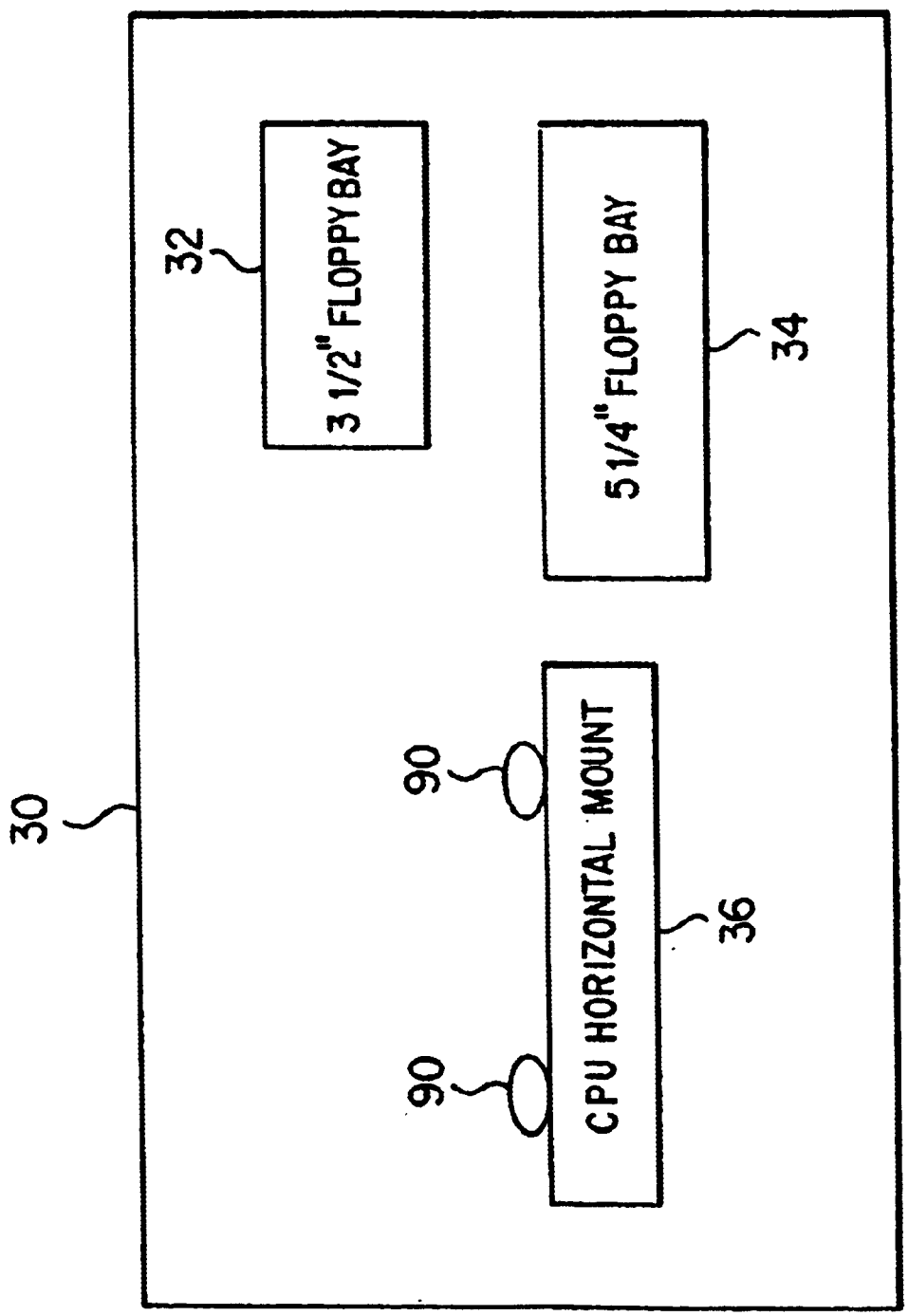
FIG. 8 is a front elevation view of a computer having another locking mechanism suitable for use with one embodiment of the invention.

FIG. 8 is a front elevation view of a computer having another locking mechanism suitable for use with one embodiment of the invention. As shown in FIG. 8, teeth locks 90 are mounted on the SEC case for processor 40. In addition, a guiding arrangement similar to that described with reference to FIG. 5 is used, except that guide block 62 is adapted to push processor 40 upwards so that teeth locks 90 prevent processor 40 from being removed. For example, a lock operated spring, or some other mechanism can be used for moving processor 40 upwards to lock it in place, or downwards to unlock it.

Figure 10:
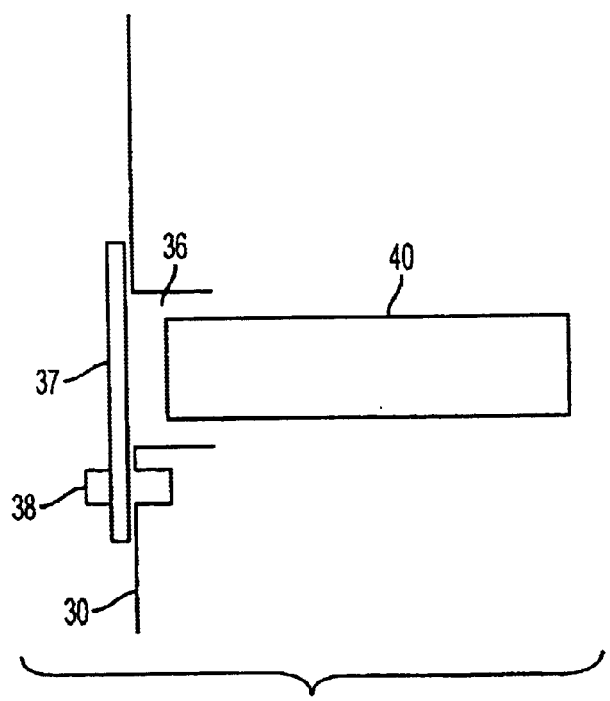
FIG. 10 is a partial side elevation view of a computer showing still another locking mechanism suitable for use with one embodiment of the invention.

Although various embodiments are specifically illustrated and described herein, it will be appreciated that modifications and variations of the present invention are covered by the above teachings and within the purview of the appended claims without departing from the spirit and intended scope of the invention. For example, although various examples of guide means are disclosed herein, it can be appreciated that any apparatus to guide connector 46 for processor 40 into connector 44 for motherboard 20, falls within the scope of the invention. Similarly, various locking mechanisms can be used with the present invention and still fall within the scope of the invention. For example, as shown in FIG. 10 the apparatus to prevent processor 40 from being removed could comprise a clear plate or lattice structure 37 for covering slot 36 in case 30, and a lock assembly 38 for locking the plate or lattice structure 37 to case 30.

What is claimed is:

1. A mount to receive a cartridge processor having an edge connector, comprising:

a motherboard connector to be mounted on a motherboard to receive said edge connector with said processor in an orientation parallel to and displaced from said motherboard.

2. The mount of claim 1 further comprising:

guides to restrain said processor from movement.

3. The mount of claim 2, wherein said guides comprise a pair of guide rails attached to said processor, and a pair of guide slots attached to said motherboard, with said guide slots configured to receive said guide rails.

4. The mount of claim 1, further comprising a case surrounding said motherboard, said case having a slot through which said connector can be inserted into said receiving slot without removing said case.

5. The mount of claim 4, wherein said case has an interior side and an exterior side, and wherein said processor is visible from said exterior side.

6. The mount of claim 1, wherein said processor includes a heat sink.

7. The mount of claim 1, further comprising a lock for preventing unauthorized removal of said processor from said motherboard.

8. The mount of claim 7, wherein said lock comprises teeth locks.

9. The mount of claim 7, wherein said lock comprises a spring lock assembly.

10. The mount of claim 7, wherein said lock comprises a plate for covering said slot in said case, and a lock assembly for locking said plate to said case.

11. A mount for a processor, comprising:

a motherboard;

a receiving slot connected to said motherboard and configured to receive a connector for a cartridge processor;

guides for guiding said connector into said receiving slot, wherein said processor is parallel to and displaced from said motherboard after said connector is inserted into said receiving slot.

12. The mount of claim 11, wherein said guides include a pair of guide slots connected to said motherboard, and a pair of guide rails connected to said processor, with said guide slots configured to receive said guide rails.

13. A mount for a processor, comprising:

a motherboard;

a single edge connector cartridge processor having a connector;

a receiving slot connected to said motherboard and configured to receive said connector;

guides for guiding said connector into said receiving slot, wherein said processor is parallel to and displaced from said motherboard after said connector is inserted into said receiving slot.

14. The mount of claim 13, wherein said guides comprise a pair of guide rails connected to said processor, and a pair of guide slots connected to said motherboard, with said guide slots configured to receive said guide rails.

15. A method of mounting a cartridge processor having an edge connector on a motherboard comprising:

inserting the edge connector of said processor in a connector on said motherboard, said processor having an orientation parallel to and displaced from said motherboard.

16. The method of claim 15 wherein in said inserting step, said processor is inserted in said motherboard in a first direction, the method further comprising:

restraining said processor from movement in directions mutually perpendicular to said first direction.

17. A horizontal mount for a processor, comprising:

guides to guide a connector into a receiving slot on a motherboard; and a single edge connector cartridge processor having a connector coupled to said motherboard in a direction parallel to and displaced from said motherboard.

* * * * *